United States Patent
Van Ettinger et al.

(10) Patent No.: US 12,498,529 B2
(45) Date of Patent: Dec. 16, 2025

(54) OPTO-ELECTRONIC ASSEMBLIES

(71) Applicant: Hilight Semiconductor Limited, Southampton (GB)

(72) Inventors: Rudolf Van Ettinger, Southampton (GB); Patrick Richard, Southampton (GB); Richard Horn, Southampton (GB); William Redman-White, Southampton (GB)

(73) Assignee: Hilight Semiconductor Limited (GB)

( * ) Notice: Subject to any disclaimer, the term of this patent is extended or adjusted under 35 U.S.C. 154(b) by 280 days.

(21) Appl. No.: 18/124,216

(22) Filed: Mar. 21, 2023

(65) Prior Publication Data
US 2023/0305246 A1 Sep. 28, 2023

(30) Foreign Application Priority Data
Mar. 25, 2022 (GB) .................................. 2204275

(51) Int. Cl.
*H04B 10/00* (2013.01)
*G02B 6/42* (2006.01)

(52) U.S. Cl.
CPC ......... *G02B 6/4274* (2013.01); *G02B 6/4246* (2013.01)

(58) Field of Classification Search
CPC .. H03F 1/08; H03F 2203/45664; H03F 3/087; H03F 2200/78; H03F 2203/45136;
(Continued)

(56) References Cited

U.S. PATENT DOCUMENTS

| | | | |
|---|---|---|---|
| 5,646,763 A | 7/1997 | Misaizu et al. |
| 6,057,736 A | 5/2000 | Kim et al. |

(Continued)

FOREIGN PATENT DOCUMENTS

| | | |
|---|---|---|
| EP | 0545536 | 6/1993 |
| EP | 0577896 | 1/1994 |

(Continued)

OTHER PUBLICATIONS

Van Ettinger, Rudolf; Search Report for United Kingdom application No. GB2303182.6, mailed May 2, 2023, 4 pgs.
(Continued)

*Primary Examiner* — Agustin Bello
(74) *Attorney, Agent, or Firm* — Taylor Duma LLP

(57) ABSTRACT

An assembly of electronic components for reception of data using an optical fibre wherein said assembly comprises: a photodiode; a first amplifier coupled to said photodiode; a second amplifier, whose electrical behaviour is substantially identical to an electrical behaviour of said first amplifier; an impedance network comprising at least two electronic components coupled between an input of said second amplifier and a reference terminal, wherein those at least two electronic components comprise at least two impedance elements, one impedance element being capacitive and another being resistive or inductive, and wherein said at least two electronic components are adjustable under electronic control to adjust the impedance presented by said impedance network; and circuitry for creating a signal formed from a subtraction of outputs of the first and second amplifiers.

13 Claims, 9 Drawing Sheets

(58) Field of Classification Search
CPC ....... H03F 2203/45544; H03F 3/45475; H03F 2200/453; H03F 2203/45528; H03F 1/26; H03F 3/085; H03F 1/083; H03F 3/45609; H03F 3/4595; H03F 3/08; H03F 2200/429; G02B 6/4274; G02B 6/4246; H04B 10/693; H04B 10/60; H04B 10/6973

See application file for complete search history.

(56) References Cited

U.S. PATENT DOCUMENTS

| | | |
|---|---|---|
| 6,307,433 B1 | 10/2001 | Ikeda |
| 6,629,638 B1 | 10/2003 | Sanchez |
| 10,535,978 B2 | 1/2020 | Redman-White et al. |
| 2002/0175272 A1 | 11/2002 | Shimizu |
| 2004/0173729 A1 | 9/2004 | Shimizu et al. |
| 2005/0047801 A1 | 3/2005 | Schrodinger |
| 2008/0309407 A1 | 12/2008 | Nakamura et al. |
| 2009/0080905 A1 | 3/2009 | Olsson et al. |
| 2014/0341571 A1 | 11/2014 | Noda |
| 2015/0188627 A1 | 7/2015 | Yuda et al. |
| 2015/0381129 A1* | 12/2015 | Brekelmans ............ H03G 3/18 330/254 |
| 2016/0248517 A1 | 8/2016 | Parikh |
| 2017/0163352 A1* | 6/2017 | Sugimoto ............ H04B 10/272 |
| 2020/0007087 A1* | 1/2020 | Sugimoto ............... H03F 3/087 |
| 2021/0033644 A1* | 2/2021 | D'Aquino ............ H03F 1/0277 |
| 2022/0255509 A1* | 8/2022 | Liu .......................... H03F 1/26 |
| 2023/0178962 A1 | 6/2023 | Redman-White et al. |
| 2023/0305246 A1* | 9/2023 | Van Ettinger ....... H03F 3/45609 |
| 2024/0297719 A1 | 9/2024 | Van Ettinger et al. |

FOREIGN PATENT DOCUMENTS

| | | |
|---|---|---|
| GB | 2535553 | 8/2016 |
| GB | 2552725 | 2/2018 |
| JP | H06252660 | 9/1994 |
| JP | H0774706 | 3/1995 |
| JP | 2006261866 | 9/2006 |
| JP | 2006261866 A * | 9/2006 |

OTHER PUBLICATIONS

Redman-White, William; Examination Report for United Kingdom application No. GB2117528.6, filed Dec. 3, 2021, mailed Dec. 31, 2021, 6 pgs.

Hilight Semiconductor Limited; Combined Search and Examination Report for application No. GB2204275.8, mailed Apr. 26, 2022, 11 pgs.

Redman-White, William; Requirement for Restriction/Election for U.S. Appl. No. 18/074,063, filed Dec. 2, 2022, mailed Aug. 26, 2024, 6 pgs.

Redman-White, William; Notice of Allowance for U.S. Appl. No. 18/074,063, filed Dec. 2, 2022, mailed Jan. 17, 2025, 27 pgs.

* cited by examiner

OPTO-ELECTRONIC ASSEMBLIES

CROSS-REFERENCE TO RELATED APPLICATIONS

This application claims the benefit of United Kingdom Application No. GB2204275.8 filed on Mar. 25, 2022, and entitled "Opto-electronic assemblies," which is incorporated by this reference herein in its entirety.

FIELD OF THE INVENTION

The present application relates to opto-electronic assemblies and receive optical sub-assembly design and construction.

BACKGROUND

High speed optical communication links can be configured in many forms depending on the nature of the physical length of the optical path, the type of fibre and laser used, and the data rate. The main components of a terminal node in a high speed data optical system are generally similar in function.

In the transmit path, electrical data is passed to circuitry that drives current through a laser and performs modulation of the laser's optical output in a manner that allows information to be conveyed. In the receive path, optical signals are first converted to electrical form and then passed on to various functions, which may perform some manner of signal processing with the goal of providing precise data signals to some client digital functions. Typical requirements are to perform equalisation to improve the electrical pulse shape received, limiting amplifiers to remove amplitude dependencies and possibly timing recovery operations. All of these functions depend on the raw signal from the optical reception process being free from noise and other imperfections. In a practical optical receiver system, it is likely that there are sources of noise and interference, such as from digital circuits that may be located within the same module as the optical receiver. Such noise and interference sources may become coupled into the optical receiver, hampering the reception of clean raw signals for subsequent functions to be able to process.

SUMMARY

Technologies are presented herein that provide an improved means for the reception of optical signals with improved immunity to noise and interference arising from circuits and functions close to the optical receiver. Utilizing the technologies described herein, improvements to the optical receiver function may be achieved while requiring a minimum number of additional components and without significantly increasing the size and cost of an optical receiver.

One benefit of the embodiments described herein is improvements to the noise and interference immunity of an improved optical receiver are achieved with a minimum of effort for adjustment and calibration to achieve an optimum performance.

Another benefit of the embodiments described herein is that optical signals may be received and converted to electrical form with substantial immunity to noise and interference due to other electrical functions located close to the optical receiver.

A further benefit of the embodiments described herein is that the improvements to said immunity are achieved with a minimum of additional components, cost and size.

A further benefit of the embodiments described herein is that the improvements to the immunity to noise and interference may be optimised with minimal additional effort from the user.

According to a first aspect, there is provided an assembly of electronic components for reception of data using an optical fibre wherein said assembly comprises: a photodiode; a first amplifier coupled to said photodiode; a second amplifier, whose electrical behaviour is substantially identical to an electrical behaviour of said first amplifier; an impedance network comprising at least two electronic components coupled between an input of said second amplifier and a reference terminal, wherein those at least two electronic components comprise at least two impedance elements, one impedance element being capacitive and another being resistive or inductive, and wherein said at least two electronic components are adjustable under electronic control to adjust the impedance presented by said impedance network; and circuitry for creating a signal formed from a subtraction of outputs of the first and second amplifiers.

The first amplifier and the second amplifier may be transimpedance amplifiers.

Connected to at least one terminal of said photodiode may be at least one further electronic component configured for the provision of bias supplies to the said photodiode.

The impedance network configured so that the electronic components comprised therein are adjustable so that the said impedance presented by said impedance network may be substantially the same as an impedance presented at an input of said first amplifier by said photodiode and any electronic components and any electrical conductors connected to said photodiode.

The first amplifier and the second amplifier may comprise amplifier circuits having positive and negative input connections.

The first amplifier and the second amplifier may comprise amplifier circuits having only negative input connections.

A signal source may be provided, said signal source may be configured to provide a calibration signal for an adjustment of said electronic components comprised within said impedance network.

The signal source may be connected to a reference source connected to said first amplifier and said second amplifier.

The signal source may be connected to a power supply connected to said first amplifier and said second amplifier.

The assembly of electronic components may further comprise a controller, said controller configured to receive said subtracted outputs of said first amplifier and said second amplifier in response to a signal provided by said signal source, and providing control signals to adjust said electronic components comprised within said impedance network so as to minimise a magnitude of said output resulting from said subtracted outputs of said first amplifier and said second amplifier.

According to a second aspect, there is provided a method for reception of data using an optical fibre, comprising: providing a photodiode; coupling said photodiode to a first amplifier; providing a second amplifier, whose electrical behaviour is substantially identical to said electrical behaviour of said first amplifier; providing an impedance network comprising at least two electronic components coupled between an input of said second amplifier and a reference terminal, wherein those at least two electronic components comprise at least two impedance elements, one impedance element being capacitive and another being resistive or inductive, and wherein said at least two electronic components are adjustable under electronic control to adjust the impedance presented by said impedance network; and providing circuitry for creating a signal formed from a subtraction of outputs of said first amplifier and said second amplifier.

The method may further comprise providing a signal source, said signal source configured to provide a calibration signal for an adjustment of said electronic components comprised within said impedance network.

The method may further comprise providing a controller, said controller comprising an input receiving said signal formed from said subtraction of said outputs of said first amplifier and said second amplifier, wherein said controller is configured to adjust said electronic components comprised within said impedance network so as to minimise a magnitude of said signal resulting from said subtraction of said outputs of said first amplifier and said second amplifier in response to said calibration signal.

BRIEF DESCRIPTION OF FIGURES

Some embodiments will now be described by way of example only and with reference to the accompanying drawings in which.

DETAILED DESCRIPTION

The description is not to be taken in a limiting sense but is made merely for the purposes of describing the general principles of the various embodiments.

Figure 1:
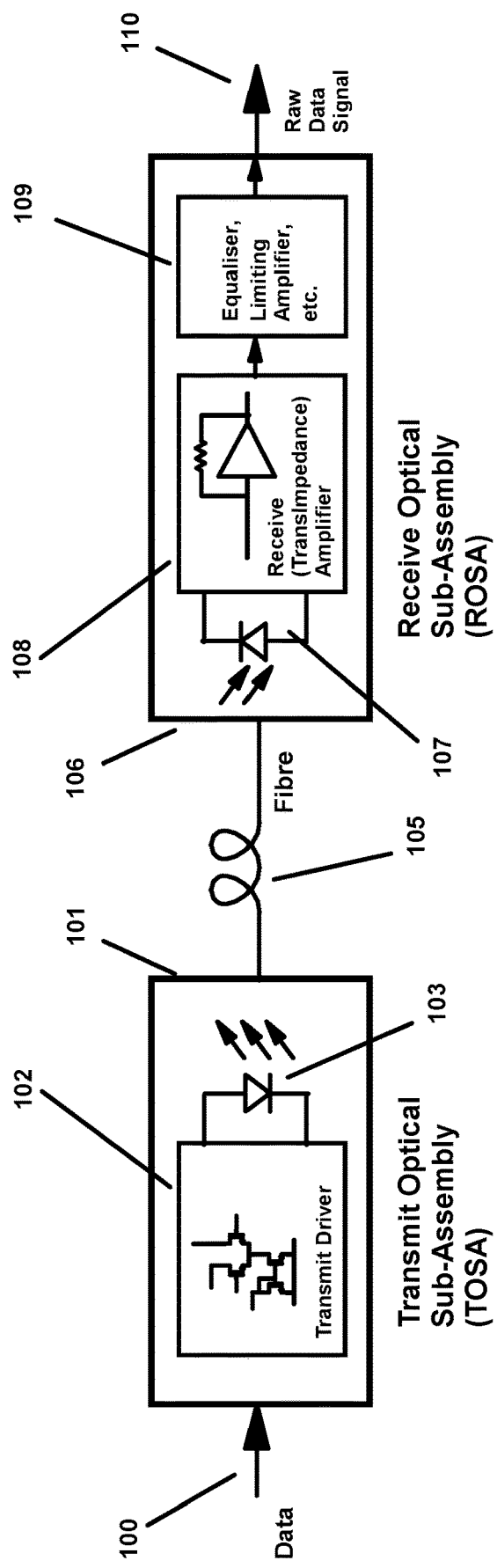
FIG. 1 shows the general arrangement for an optical fibre data communication system according to prior art.

FIG. 1 shows a typical optical communication link according to prior art. Information in the form of electrical digitally encoded data 100 is communicated to a Transmit Optical Sub-Assembly (TOSA) 101 which takes said electrical signals and using internal driver circuitry 102 modulates the current flowing in a laser 103 to provide an optical signal that is launched into the fibre 105. The fibre is connected to a Receive Optical Sub-Assembly (ROSA) 106 which may comprise a photodiode 107 which converts incident light into an electrical current. Said current may be converted into a voltage signal by means of an amplifier 108. There may be other circuitry 109 comprised within the ROSA which perform signal processing or control functions, for example, an equaliser to adjust the received pulse shape, a limiting amplifier to remove amplitude dependencies from the raw data signal 110 and other processing and control functions. It is common to use a transimpedance amplifier (TIA) as the receive amplifier 108 to perform the conversion from the photodiode current to a raw voltage signal. It is with improvements to the construction of a transimpedance amplifier used in this function that the present disclosure is concerned.

Figure 2:
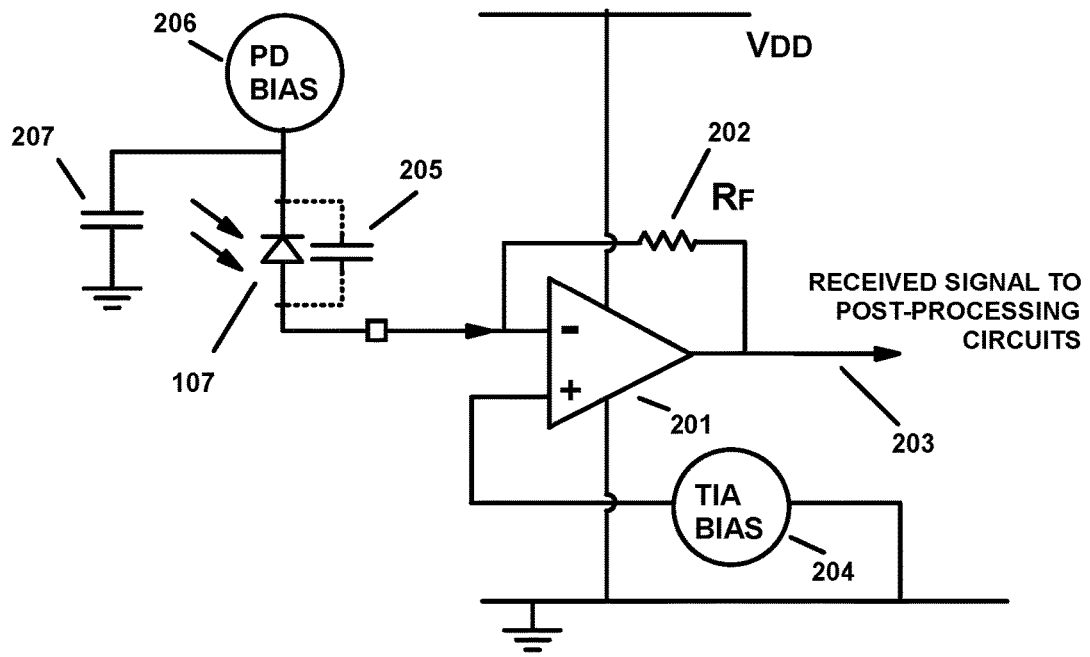
FIG. 2 shows an arrangement for an optical data receiver employing a transimpedance amplifier according to prior art.

FIG. 2 shows the architecture of a typical TIA arrangement intended for the reception of optical data signals according to prior art. Here, a conventional operational amplifier (op-amp) 201 together with a feedback resistance 202 is used as the core of the TIA, with a bias voltage 204 provided such that the non-inverting input of the op-amp is held at a potential convenient for the bias 206 of the photodiode 107. Though not shown in FIG. 2, there may also be provided an additional current bias to remove the DC offset in the output of the amplifier due to the DC component of the received optical signal. The end of the photodiode not connected to the op-amp may be connected to ground (or the positive supply, depending on the particular configuration), or it may have a bias voltage 206 applied to the end such that the said photodiode is maintained in a reverse bias condition and that the photodiode's capacitance is maintained in preferably a low value. It should be noted that the photodiode exhibits some internal capacitance that has an influence on the overall behaviour of the TIA arrangement.

The output 203 from said amplifier is passed to subsequent functions which may perform signal processing operations such as equalisation, amplitude limiting etc, before passing well defined raw data to the client system.

Figure 3:
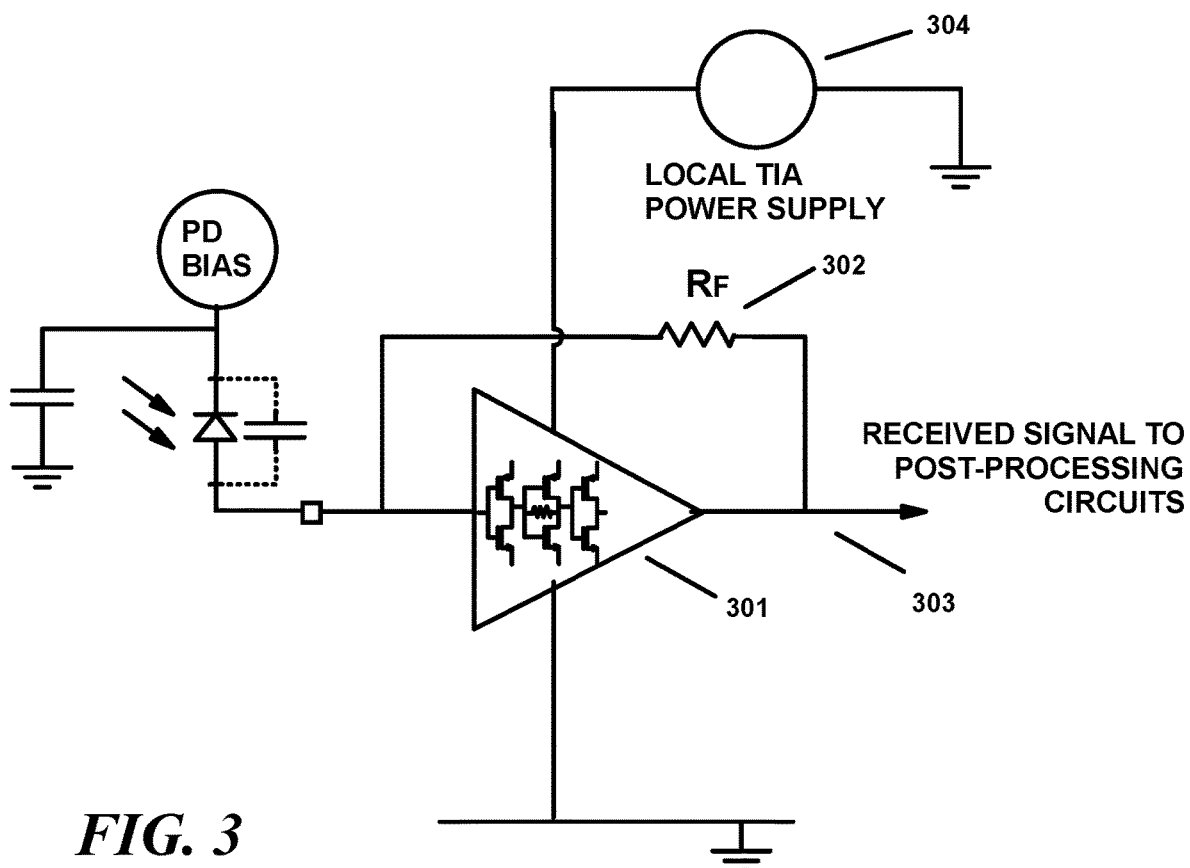
FIG. 3 shows another arrangement for an optical data receiver employing a transimpedance amplifier according to prior art.

FIG. 3 shows another architecture of a typical TIA arrangement intended for the reception of optical data signals according to prior art. In this arrangement the amplifier 301 at the core of the TIA is based on a complementary metal oxide semiconductor (CMOS) inverter type structure. Such CMOS inverter based amplifiers may typically comprise one or more CMOS inverters, and may further comprise associated local feedback and bias related components.

In this and similar arrangements the core amplifier 301 has only one input terminal and there is thus no explicit DC reference voltage for the AC virtual ground apparent at the input of said amplifier 301. The DC potential at the input of the core amplifier (and also at the output 303) is a function of the internal operating bias conditions, which are in turn a function of the power supply voltage 304 applied to said core amplifier. The transimpedance may be defined in a conventional way by means of the feedback impedance element 302, typically a resistor. Though not shown in FIG. 3, there may also be provided an additional current bias to remove the DC offset in the output of the amplifier due to the DC component of the received optical signal.

In many such arrangements, it is common to regulate and adjust the local power supply 304 in order to set the operating bias conditions. Such biasing arrangements will be well known to one skilled in the art.

In any of the foregoing configurations, the said connection to the photodiode not connected to the TIA should preferably behave as a ground for AC signals. In the case where a bias voltage 206 is used, there may be provided some decoupling components, for example a capacitance 207. Similarly, reference bias 204 provided to the TIA non-inverting reference input in an op-amp type configuration should also preferably behave as a ground for AC signals.

Figure 4:
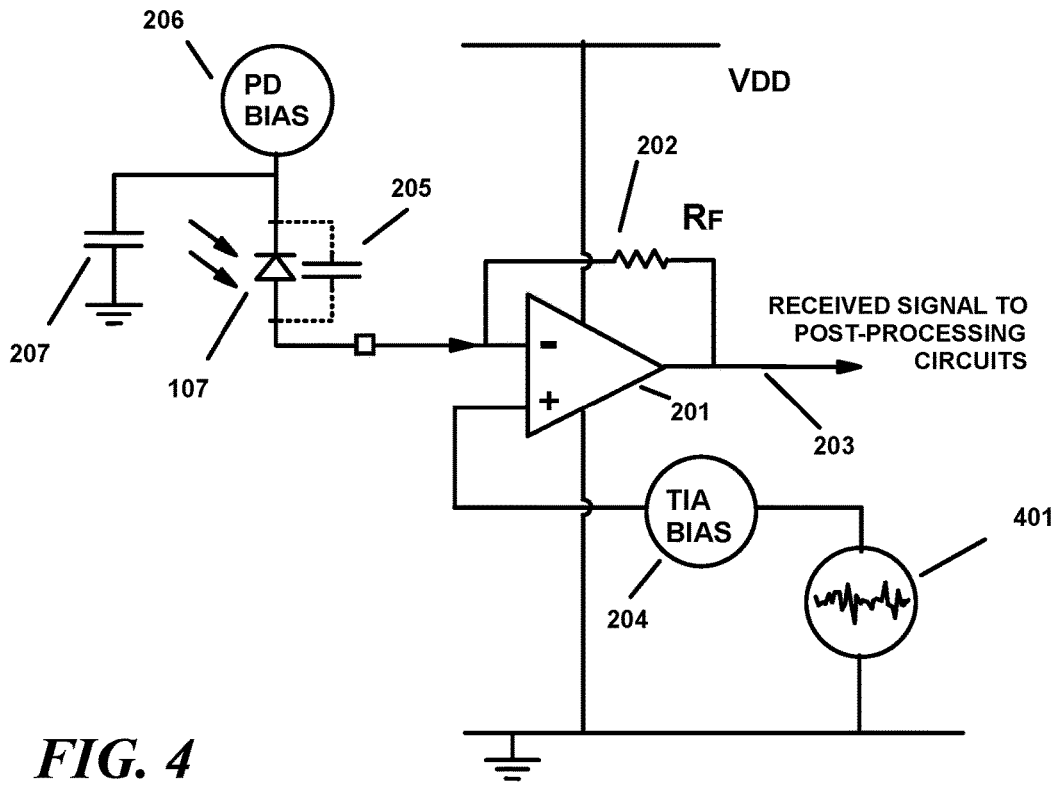
FIG. 4 shows a representation of the means of ingress of noise and interference into an arrangement for an optical data receiver employing a transimpedance amplifier according to prior art.

FIG. 4 shows the architecture of a typical TIA arrangement intended for the reception of optical data signals according to prior art, wherein a conventional op-amp 201 is employed, and wherein the sources of noise and interference are represented by a source 401 in series with the reference bias 204 provided to the non-inverting input of said op-amp. The reference for the non-inverting terminal of the op-amp is preferably provided within the integrated circuit containing said op-amp for reasons of costs and size. In such arrangements where a conventional op-amp is used, there may be significant rejection of noise and interference present in the power supply connections, but there remains significant sensitivity to said noise and interference at the input terminals. It will be apparent to one skilled in the art that noise and interference present inside the IC is unlikely to be exactly replicated at the bias terminal of the photodiode, and thus there is unlikely to be significant rejection of said noise and interference by the amplifier's input common-mode rejection properties.

It will also therefore be apparent that any such noise and interference that may be communicated to the reference non-inverting terminal of the amplifier 201 will affect the output of the complete TIA arrangement.

Figure 5:
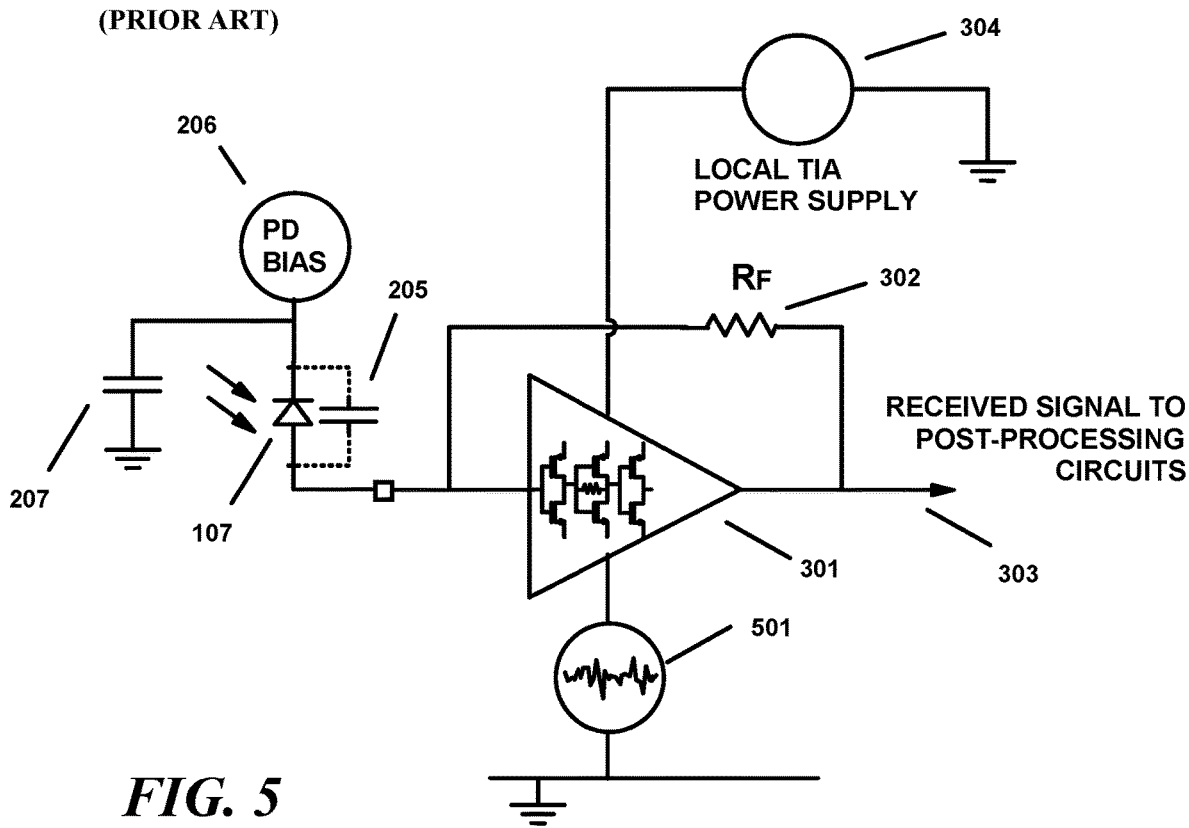
FIG. 5 shows a representation of another means of ingress of noise and interference into an arrangement for an optical data receiver employing a transimpedance amplifier according to prior art.

FIG. 5 shows an architecture of a typical TIA arrangement intended for the reception of optical data signals according to prior art, wherein a CMOS inverter based structure 301 is used in the core of the TIA. In this arrangement, there is no explicit reference voltage for the amplifier's input to provide a virtual AC ground, and hence noise and interference from such an explicit reference are not relevant. However, it will be well known to one skilled in the art that such CMOS inverter based amplifier arrangements have little capability to reject noise and interference present in series with the power supplies to the inverter arrangement. In FIG. 5 noise and interference present in series with the internal local ground connection are represented by a source 501. Noise and interference from such a source will become easily coupled to the signal path output 303 of said CMOS inverter based amplifier.

Figure 6:
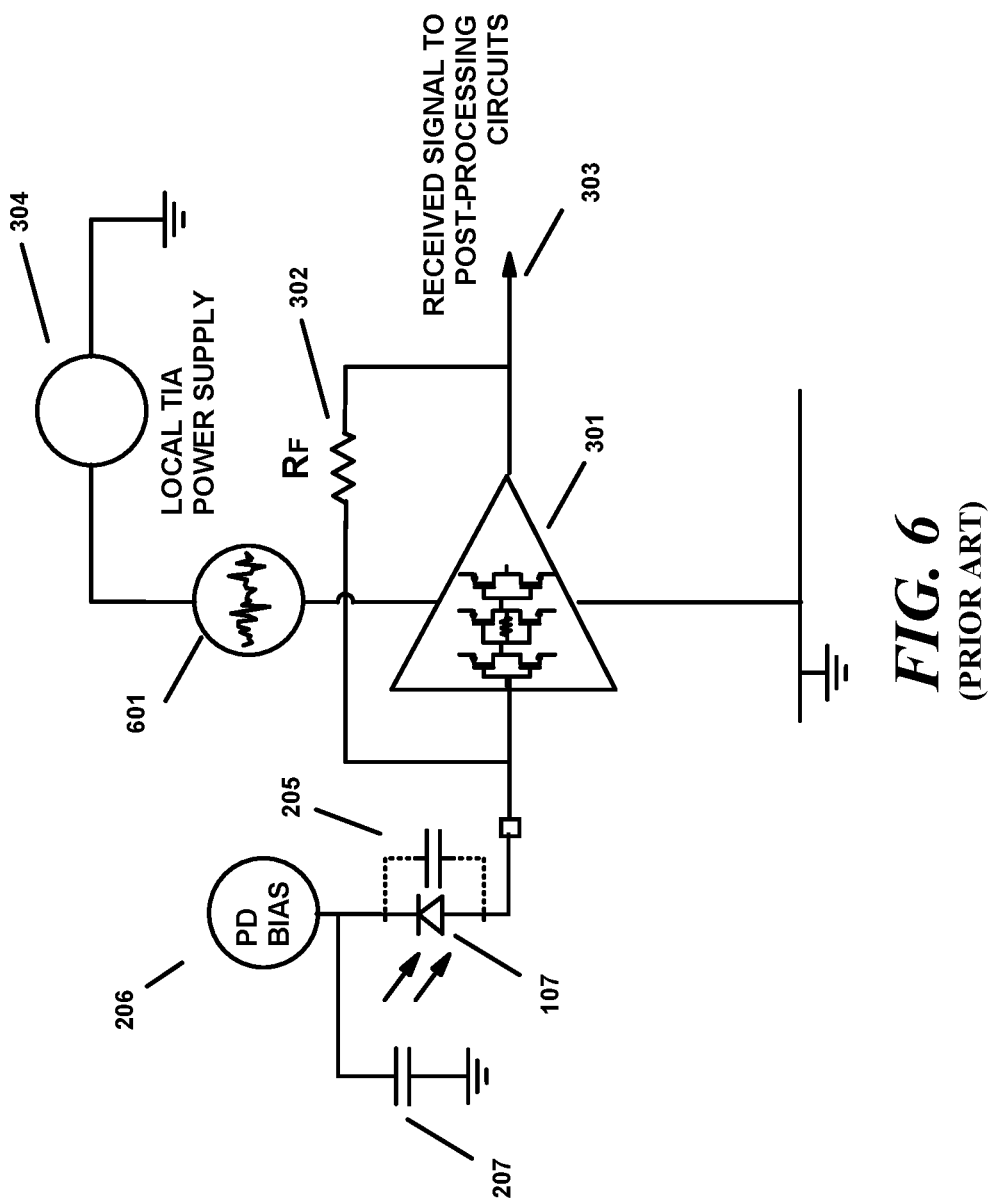
FIG. 6 shows a representation of another means of ingress of noise and interference into an arrangement for an optical data receiver employing a transimpedance amplifier according to prior art.

Similarly, FIG. 6 shows an architecture of a typical TIA arrangement intended for the reception of optical data signals according to prior art, wherein a CMOS inverter based structure 301 is used in the core of the TIA. In this figure, noise and interference present in the power supply 304 to said CMOS inverter based amplifier are represented by a source 601. Noise and interference from such a source will become easily coupled to the signal path output 303 of said CMOS inverter based amplifier.

Figure 7:
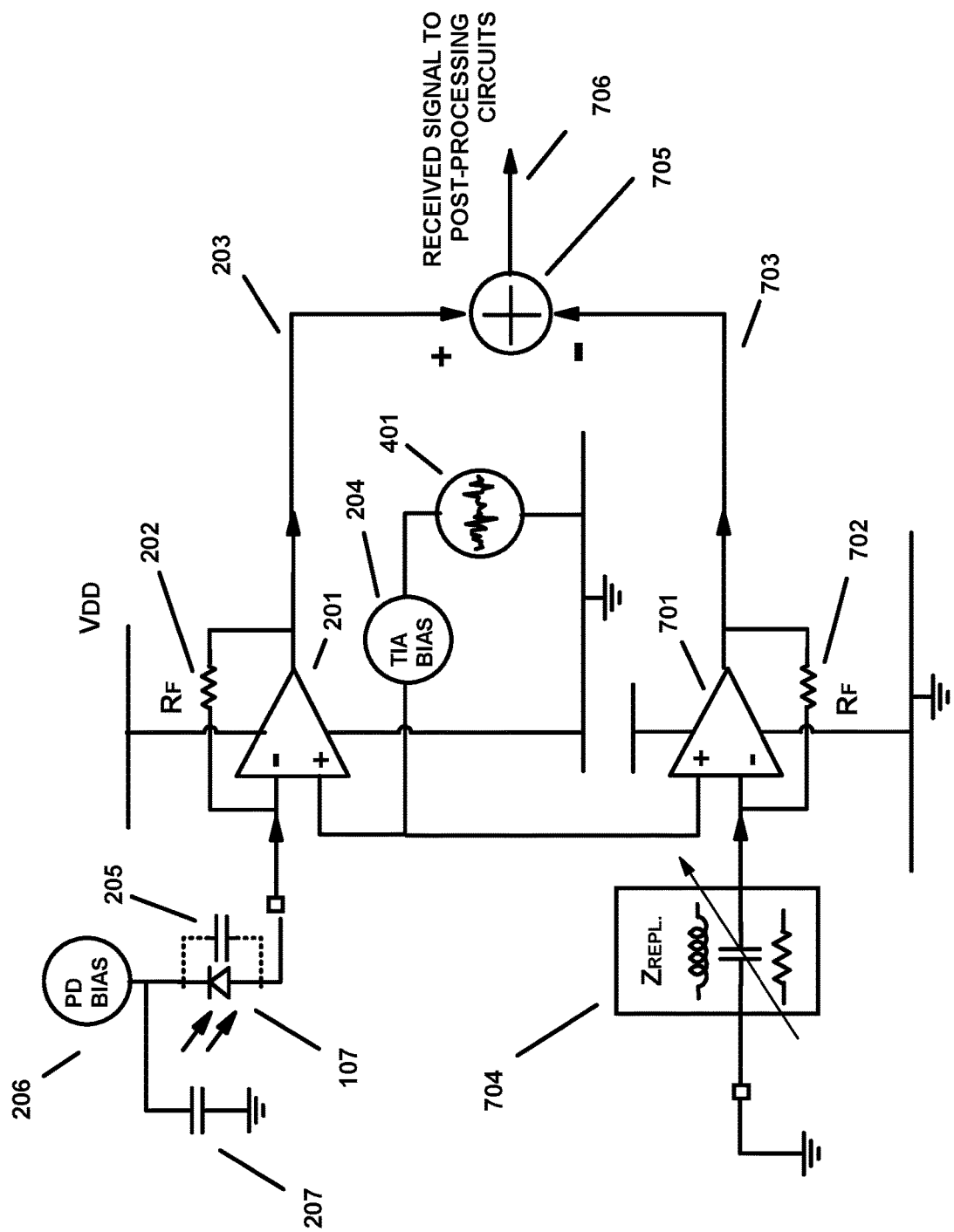
FIG. 7 shows an arrangement for an optical data receiver according to embodiments described herein.

FIG. 7 shows an arrangement of electronic components according to embodiments wherein the amplification function employs an op-amp 201 structure with a feedback impedance 202 at the core of the TIA function. Optical data signals incident on the photodiode 107 create a current signal that is converted into a raw voltage signal 203 by means of the TIA. A second replica TIA is comprised of an identical op-amp 701 and associated feedback impedance 702 such that the gain, bandwidth and phase responses of said replica TIA is substantially identical to the TIA performing the signal amplification and conversion function.

Sources of noise and interference are represented by a source 401 in series with the reference bias 204 provided to the non-inverting input of the said op-amps (201, 701).

At the inverting (virtual ground) input of said replica TIA there is also connected an impedance network 704. Said impedance network is also connected to a ground connection, preferably, to the same ground connection used for the photodiode 107 or to the AC ground reference for any bias supply 206 to the photodiode. The non-inverting input of the said replica TIA is connected to the reference 204 used by the TIA in the signal path.

The said impedance network 704 connected to the replica TIA (701, 702) is configured so that the impedance seen from the input of the replica TIA to the ground connection at the other terminal of the said impedance network is substantially the same as the impedance seen from the input of the signal path TIA (201, 202) through the photodiode 107 to the ground or AC ground connection at the other terminal of the said photodiode. It will be obvious to one skilled in the art that a simplistic implementation of the impedance required to be presented by the said network 704 may be comprised of a single capacitance, in order to match the capacitive component of the photodiode's small signal impedance. However, depending on the physical configuration of the complete assembly there is a requirement for the impedance network to further comprise other components such as inductive and resistive circuit elements. Further there is a strong need for said components to be adjustable in nature to allow for the behaviour of said impedance network to be optimised to achieve the desired circuit conditions.

It will be apparent to one skilled in the art that by configuring a replica TIA path wherein the amplifier itself and the impedance seen at its input results in said replica TIA exhibiting a substantially identical magnitude and phase response to the TIA in the signal path, there is provided a means for rejection of significant levels of noise and interference (represented by a source 401) as may be present in a reference used by both TIA structures. By subtracting 705 the outputs of the signal path TIA 203 and the replica path TIA 703, it is clearly possible to substantially reject the influence of said noise and interference, and a more faithful signal representation of the incoming optical signal 706 can be passed to subsequent functions such as equalisation and limiting circuits.

Figure 8:
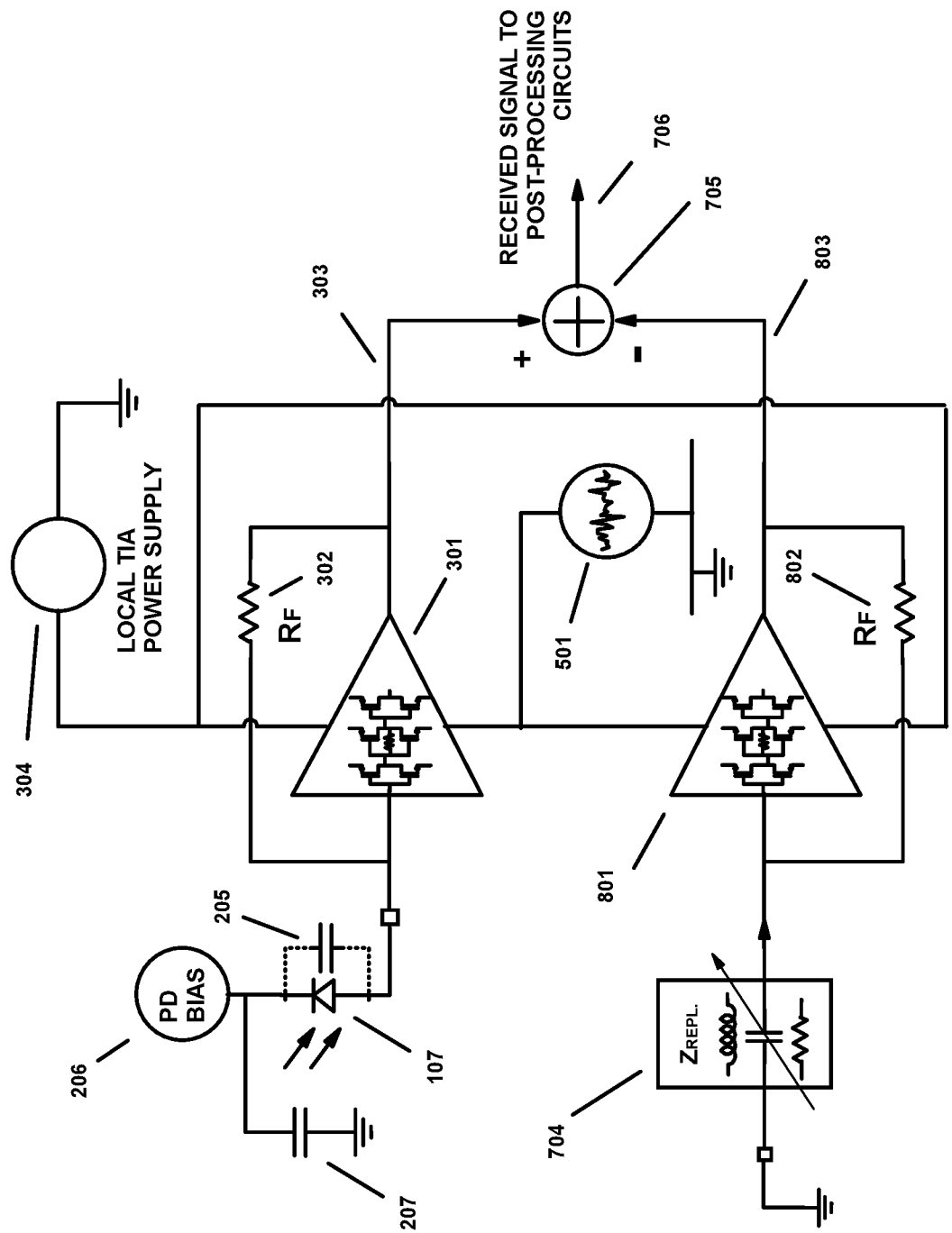
FIG. 8 shows an arrangement for an optical data receiver according to embodiments described herein.

FIG. 8 shows an arrangement according to further embodiments. The TIA converting the photodiode current to a raw signal voltage shown here employs a CMOS inverter based amplifier 301 together with an associated feedback impedance element 302. A second replica TIA is comprised of an identical CMOS inverter based amplifier 801 and associated feedback impedance 802 such that the gain, bandwidth and phase responses of said replica TIA is substantially identical to the TIA performing the signal amplification and conversion function. At the (virtual ground) input of said replica TIA there is also connected an impedance network 704. Said impedance network is also connected to a ground connection, preferably, to the same ground connection used for the photodiode 107 or as the AC ground reference for any bias supply 206 to the photodiode.

It will be apparent to one skilled in the art that by configuring a replica TIA path wherein the amplifier itself and the impedance seen at its input results in said replica TIA exhibiting a substantially identical magnitude and phase response to the TIA in the signal path, there is provided a means for rejection of significant levels of noise and interference (represented by a source 501) as may be present in the local ground connection used by both TIA structures. By subtracting the outputs of the signal path TIA 303 and the replica path TIA 803, it is clearly possible to substantially reject the influence of said noise and interference, and a more faithful signal representation of the incoming optical signal 706 can be passed to subsequent functions such as equalisation and limiting circuits.

Figure 9:
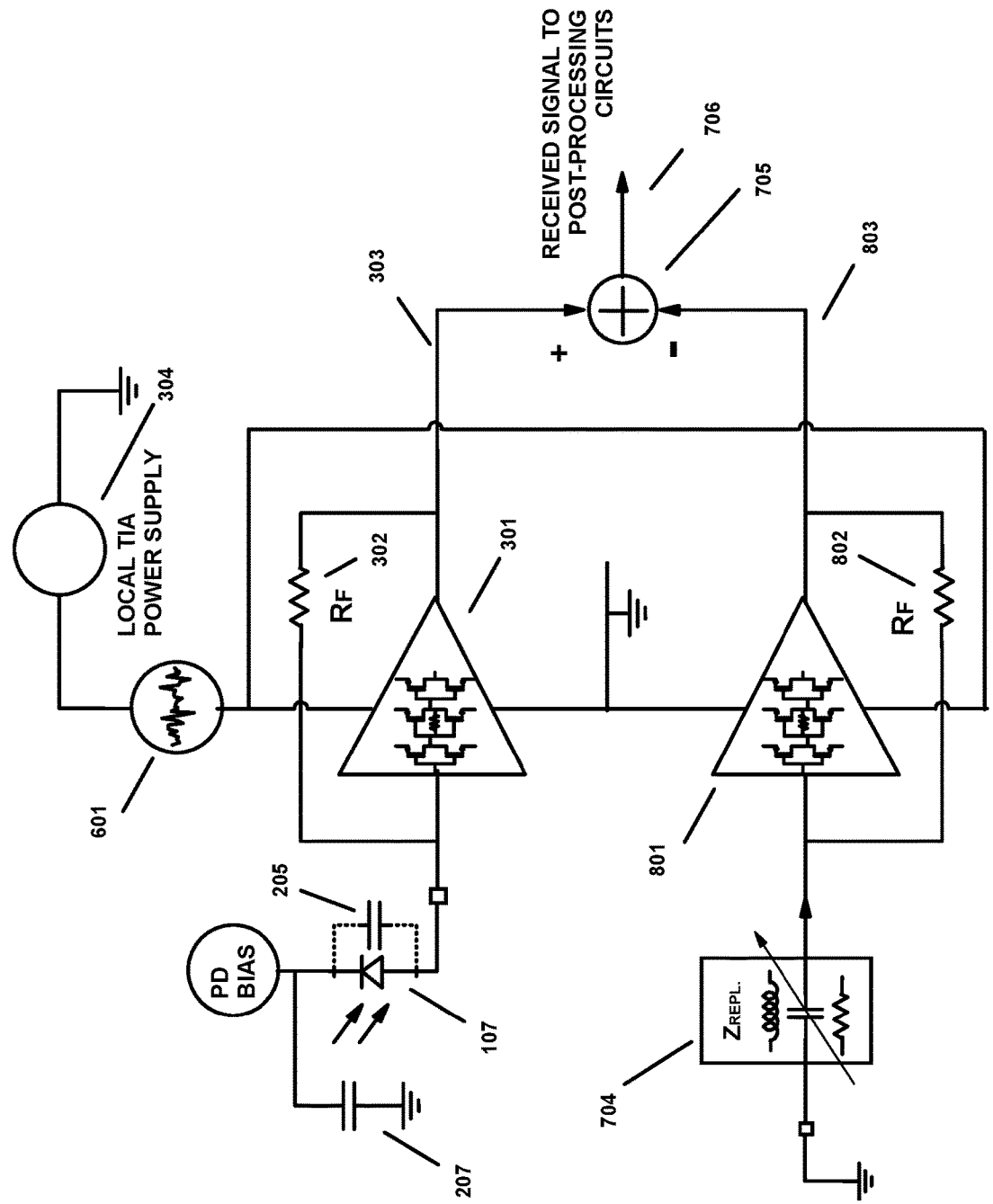
FIG. 9 shows an arrangement for an optical data receiver according to embodiments described herein.

FIG. 9 shows again the arrangement presented in FIG. 8 according to further embodiments. It will be apparent to one skilled in the art that the configuration described with reference to FIG. 8 also provides a means for rejection of significant levels of noise and interference (represented by source 601) as may be present in the power supply connection used by both TIA structures. By subtracting the outputs of the signal path TIA 303 and the replica path TIA 803, it is clearly possible to substantially reject the influence of said noise and interference, and a more faithful signal representation of the incoming optical signal 706 can be passed to subsequent functions such as equalisation and limiting circuits.

Figure 10:
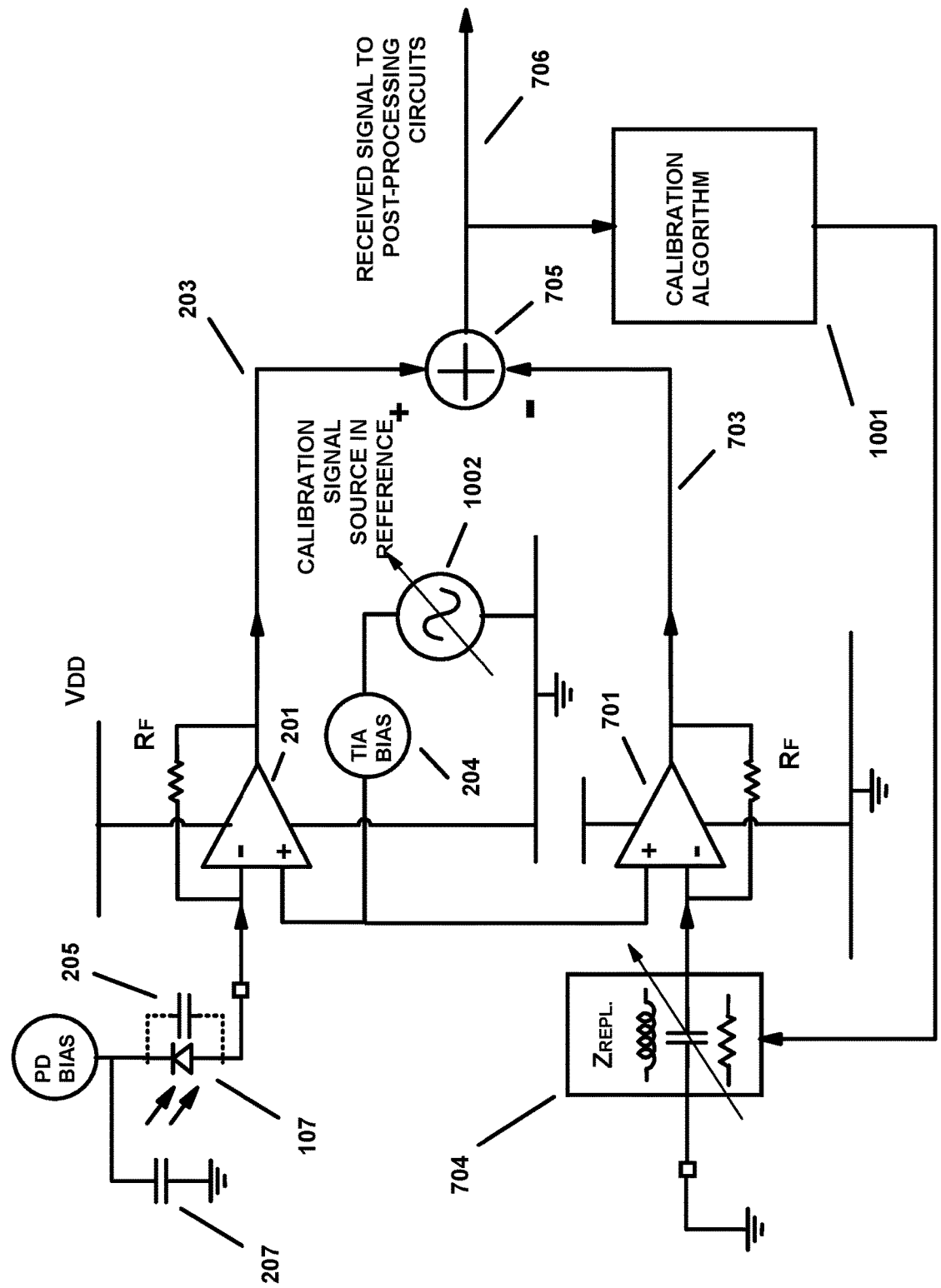
FIG. 10 shows an arrangement for an optical data receiver according to embodiments described herein.

FIG. 10 shows an arrangement according to further embodiments. In this embodiment the signal path TIA is comprised of an op-amp type amplifier at its core 201. There is also a replica TIA path comprised of an identical TIA (701, 702) and an impedance network 704 provided to be able to present an impedance substantially the same as the impedance seen at the input of the signal path TIA as previously described.

It will be apparent to one skilled in the art that in order for said impedance network 704 to be configured to present the required impedance being substantially the same as the impedance presented by the photodiode 107 and its connections, there will typically be a need to make adjustments of some kind to said impedance network. These adjustments to the impedance presented by the network 704 can be implemented in a variety of ways. For example, capacitances, inductances and resistances can be conveniently selected under digital control by means of MOS switching transistors. Alternatively, some continuously variable components may be used in the impedance network.

If the photodiode 107 used is always of the same type, and always used in the same bias conditions, and further the physical configuration is always the same, then the adjustments to the said impedance network between each manufactured ROSA 106 will be negligible or minor in nature. Hence the electronic components comprising said impedance network may be fixed during assembly, or alternatively, electronic settings for internal component selections may be stored in an internal memory following factory optimisation of a product. However, if an integrated circuit implementation of the embodiments is to be used with more than one type of photodiode, or in more than one style of physical construction, it will be apparent that more significant adjustments to the impedance network 704 behaviour may be required. In FIG. 10 there is provided a test signal source 1002 in series with the bias reference 204 for the TIA functions. Said test signal source 1002 may be activated during a period in which there is no optical input to the signal path TIA, so that there are ideally no other signals present in the system at this time. If the behaviour of the impedance network 704 and the replica TIA (701, 702) is ideally matched to that of the signal path, then the test signal will appear at the outputs of both the signal path TIA 203 and the replica TIA 703 having equal magnitude and phase, and hence when subtracted 705 will be ideally cancelled in the resulting output 706.

There is also provided a calibration function 1001 which is connected to the output formed from the subtraction of the signal path and the replica path. Said calibration function receives the result of said subtraction and using an algorithm determines the nature of adjustments to be made to the impedance network—704 such that the signal 706 resulting from said subtraction 705 is minimised and ideally reduced to a negligible level. The nature of these adjustments is then stored within the arrangement. With the impedance network 704 so configured, the test source 1002 may be disconnected or disabled, and the arrangement returned to an operational condition wherein the replica TIA and the impedance network will provide substantial rejection of noise and interference present.

Figure 11:
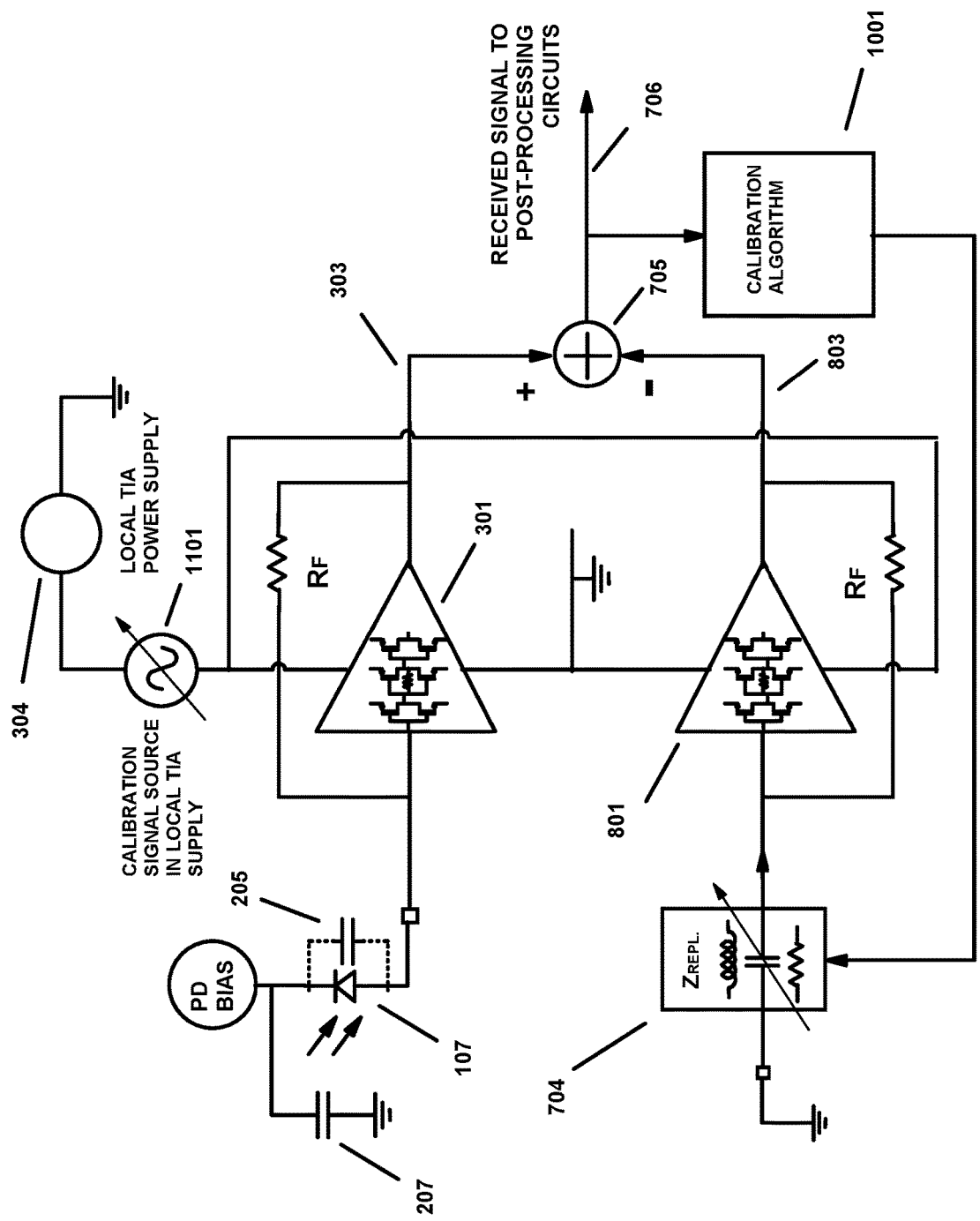
FIG. 11 shows an arrangement for an optical data receiver according to embodiments described herein.

FIG. 11 shows an arrangement according to further embodiments. In this arrangement, the TIA functions (301. 302), (701, 702) are implemented using CMOS inverter based amplifiers. As noted above, the main sensitivity to noise and interference for such CMOS inverter based amplifiers is via the power supply connections, and therefore in this arrangement there is provided a signal source 1101 in series with the local power supply 304 provided for the TIA functions. This source 1101 may be conveniently provided by a configuration of said local power supply 304 circuits, which will typically have regulation and bias functions included as part of the normal regulation of the TIA operating conditions.

Said test signal source 1101 may be activated during a period in which there is no optical input to the signal path TIA, so that there are ideally no other signals present in the system at this time. If the behaviour of the impedance network 704 and the replica TIA (701, 702) is ideally matched to that of the signal path, then the test signal will appear at the outputs of both the signal path TIA 303 and the replica TIA 803 having equal magnitude and phase, and hence when subtracted 705 will be ideally cancelled in the resulting output 706.

The calibration function 1001 receives the result of said subtraction and using an algorithm determines the nature of adjustments to be made to the impedance network 704 such that the signal 706 resulting from said subtraction 705 is minimised and ideally reduced to a negligible level. The nature of these adjustments is then stored within the arrangement. With the impedance network so configured, the test source 1101 may be disconnected or disabled, and the arrangement returned to an operational condition wherein the replica TIA and the impedance network will provide substantial rejection of noise and interference present.

Whilst the technologies presented herein have been described with reference to particular examples and possible embodiments thereof these should not be interpreted as restricting the scope of the disclosure in any way. It is to be made clear that many other possible embodiments, modifications and improvements may be incorporated into or with the embodiments without departing from the scope and spirit of the invention as set out in the claims.

What is claimed is:

1. An assembly of electronic components for reception of data using an optical fibre, wherein said assembly comprises:
    a photodiode;
    a first amplifier coupled to said photodiode;
    a second amplifier, whose electrical behaviour is substantially identical to an electrical behaviour of said first amplifier;
    an impedance network comprising at least two electronic components, wherein a first terminal of said impedance network is coupled only to a reference terminal and a second terminal of said impedance network is coupled only to an input of said second amplifier, wherein said at least two electronic components comprise at least two impedance elements, one impedance element being capacitive and another being resistive or inductive, and wherein said at least two electronic components are adjustable under electronic control to adjust the impedance presented by said impedance network; and circuitry for creating a signal formed from a subtraction of outputs of the first and second amplifiers.

2. The assembly of electronic components as claimed in claim 1, wherein said first amplifier and said second amplifier are transimpedance amplifiers.

3. The assembly of electronic components as claimed in claim 1, wherein connected to at least one terminal of said photodiode is at least one further electronic component configured for the provision of bias supplies to the said photodiode.

4. The assembly of electronic components as claimed in claim 1, wherein said impedance network is configured so that the electronic components comprised therein are adjustable so that the said impedance presented by said impedance network is substantially the same as an impedance presented at an input of said first amplifier by said photodiode and any electronic components and any electrical conductors connected to said photodiode.

5. The assembly of electronic components as claimed in claim 1, wherein said first amplifier and said second amplifier comprise amplifier circuits having positive and negative input connections.

6. The assembly of electronic components as claimed in claim 1, wherein said first amplifier and said second amplifier comprise amplifier circuits having only negative input connections.

7. The assembly of electronic components as claimed in claim 1, wherein a signal source is provided to said first amplifier and said second amplifier during a period in which there is no optical input to said photodiode, said signal source configured to provide a calibration signal derived from said signal formed from a subtraction of outputs of said first and second amplifiers for an adjustment of said electronic components comprised within said impedance network.

8. The assembly of electronic components as claimed in claim 7, wherein said signal source is connected to a reference source connected to said first amplifier and said second amplifier.

9. The assembly of electronic components as claimed in claim 7, wherein said signal source is connected to a power supply connected to said first amplifier and said second amplifier.

10. The assembly of electronic components as claimed in claim 7, further comprising a controller, said controller configured to receive said subtracted outputs of said first amplifier and said second amplifier in response to a signal provided by said signal source, and providing control signals to adjust said electronic components comprised within said impedance network so as to minimise a magnitude of said output resulting from said subtracted outputs of said first amplifier and said second amplifier.

11. A method for reception of data using an optical fibre, the method comprising:

providing a photodiode;

coupling said photodiode to a first amplifier;

providing a second amplifier, whose electrical behaviour is substantially identical to said electrical behaviour of said first amplifier;

providing an impedance network comprising at least two electronic components, wherein a first terminal of said impedance network is coupled only to a reference terminal and a second terminal of said impedance network is coupled only to an input of said second amplifier, wherein said at least two electronic components comprise at least two impedance elements, one impedance element being capacitive and another being resistive or inductive, and wherein said at least two electronic components are adjustable under electronic control to adjust the impedance presented by said impedance network; and providing circuitry for creating a signal formed from a subtraction of outputs of said first amplifier and said second amplifier.

12. The method as claimed in claim 11, further comprising providing a signal source to said first amplifier and said second amplifier during a period in which there is no optical input to said photodiode, said signal source configured to provide a calibration signal derived from said signal formed from a subtraction of outputs of said first and second amplifiers for an adjustment of said electronic components comprised within said impedance network.

13. The method as claimed in claim 12, further comprising providing a controller, said controller comprising an input receiving said signal formed from said subtraction of said outputs of said first amplifier and said second amplifier, wherein said controller is configured to adjust said electronic components comprised within said impedance network so as to minimise a magnitude of said signal resulting from said subtraction of said outputs of said first amplifier and said second amplifier in response to said calibration signal.

* * * * *